United States Patent
Bae et al.

(10) Patent No.: US 7,732,222 B2
(45) Date of Patent: Jun. 8, 2010

(54) MAGNETIC MEMORY DEVICE AND METHOD OF FABRICATING THE SAME

(75) Inventors: Jun-Soo Bae, Gyeonggi-do (KR);
Jang-Eun Lee, Gyeonggi-do (KR);
Hyun-Jo Kim, Gyeonggi-do (KR);
Se-Chung Oh, Gyeonggi-do (KR);
Kyung-Tae Nam, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 120 days.

(21) Appl. No.: 11/465,075

(22) Filed: Aug. 16, 2006

(65) Prior Publication Data
US 2007/0041243 A1 Feb. 22, 2007

(30) Foreign Application Priority Data
Aug. 16, 2005 (KR) ................. 10-2005-0074937

(51) Int. Cl.
*H01L 21/00* (2006.01)
(52) U.S. Cl. .................... 438/3; 257/E21.665
(58) Field of Classification Search ............ 257/421, 257/E21.001, E21.008, E21.665, E43.004, 257/E29.343; 360/324; 438/123, 3; 365/158, 365/173, 171
See application file for complete search history.

(56) References Cited

U.S. PATENT DOCUMENTS

| | | | |
|---|---|---|---|
| 6,266,217 B1 * | 7/2001 | Ruigrok et al. | 360/320 |
| 6,594,121 B1 * | 7/2003 | Saito | 360/314 |
| 6,751,074 B2 * | 6/2004 | Inomata et al. | 360/324.2 |
| 6,771,534 B2 | 8/2004 | Stipe | |
| 6,847,510 B2 * | 1/2005 | Childress et al. | 360/324.2 |
| 6,992,921 B2 * | 1/2006 | Fukuzumi | 365/158 |
| 7,518,906 B2 * | 4/2009 | Ikegawa et al. | 365/158 |

(Continued)

FOREIGN PATENT DOCUMENTS
JP 2004-172614 6/2004

(Continued)

OTHER PUBLICATIONS

English language abstract of Japanese Publication No. 2004-172614.

(Continued)

*Primary Examiner*—W. David Coleman
*Assistant Examiner*—Latanya Crawford
(74) *Attorney, Agent, or Firm*—Myers Bigel Sibley & Sajovec, PA

(57) ABSTRACT

There is provided a magnetic memory device and a method of forming the same. The magnetic memory device includes an invariable pinning pattern and a variable pinning pattern on a substrate. A tunnel barrier pattern is interposed between the invariable pinning pattern and the variable pinning pattern, and the pinned pattern is interposed between the invariable pinning pattern and the tunnel barrier pattern. A storage free pattern is interposed between the tunnel barrier pattern and the variable pinning pattern, and a guide free pattern is interposed between the storage free pattern and the variable pinning pattern. A free reversing pattern is interposed between the storage and guide free patterns. The free reversing pattern reverses a magnetization direction of the storage free pattern and a magnetization direction of the guide free pattern in the opposite directions.

16 Claims, 10 Drawing Sheets

U.S. PATENT DOCUMENTS

| | | | |
|---|---|---|---|
| 2004/0136231 A1* | 7/2004 | Huai et al. | 365/158 |
| 2004/0175596 A1* | 9/2004 | Inomata et al. | 428/693 |
| 2004/0235201 A1* | 11/2004 | Albert et al. | 438/3 |
| 2004/0252590 A1 | 12/2004 | Sharma | |
| 2005/0077556 A1 | 4/2005 | Anthony et al. | |
| 2005/0157544 A1* | 7/2005 | Min et al. | 365/171 |
| 2005/0207219 A1* | 9/2005 | Lee et al. | 365/173 |
| 2005/0242382 A1* | 11/2005 | Daughton et al. | 257/295 |
| 2006/0013039 A1* | 1/2006 | Braun et al. | 365/171 |
| 2006/0067016 A1* | 3/2006 | Childress et al. | 360/324.12 |
| 2006/0102969 A1* | 5/2006 | Huai et al. | 257/421 |
| 2006/0152860 A1* | 7/2006 | Childress et al. | 360/324.2 |
| 2006/0174473 A1* | 8/2006 | Oh et al. | 29/603.08 |
| 2007/0008661 A1* | 1/2007 | Min et al. | 360/324.1 |
| 2007/0015293 A1* | 1/2007 | Wang et al. | 438/3 |
| 2007/0063690 A1* | 3/2007 | De Wilde et al. | 324/117 R |
| 2007/0189064 A1* | 8/2007 | Min et al. | 365/158 |
| 2008/0062750 A1* | 3/2008 | Jeong et al. | 365/158 |

FOREIGN PATENT DOCUMENTS

| | | |
|---|---|---|
| JP | 2005-005718 | 1/2005 |
| KR | 2005-0059044 | 6/2005 |

OTHER PUBLICATIONS

English language abstract of Japanese Publication No. 2005-005718.

* cited by examiner

MAGNETIC MEMORY DEVICE AND METHOD OF FABRICATING THE SAME

BACKGROUND OF THE INVENTION

This is a non-provisional application which claims priority from Korean Patent Application No. 2005-74937, filed on Aug. 16, 2005, in the Korean Intellectual Property Office, the contents of which are herein incorporated by reference in their entirety.

1. FIELD OF THE INVENTION

The present invention relates to a semiconductor device and a method of forming the same, and particularly, to a magnetic memory device and a method fabricating the same.

2. DESCRIPTION OF THE RELATED ART

Generally, a magnetic memory device includes two magnetic substances and a magnetic tunnel junction (MTJ) pattern including an insulating layer interposed between the two magnetic substances. The magnetic tunnel junction pattern has electric resistance varying according to magnetization directions of the two magnetic substances. The resistance in the case where the magnetization directions of the two magnetic substances are equal to each other is greater than the resistance in the case where the magnetization directions of the two magnetic substances are opposite to each other. Thus, it can be determined whether information stored in the magnetic memory device is logic "1" or logic "0" by using a voltage drop and/or a change in current amount due to such variations in resistance. The magnetic memory device is widely used because of its high speed operation, almost infinite rewritability, and non-volatility.

In general, a well-known magnetic memory cell may be programmed by magnetic fields generated from a bit line and a digit line that intersect each other. Such a magnetic memory device will now be described with reference to accompanying drawing.

FIG. 1 is a cross-sectional view of a conventional magnetic memory device.

Referring to FIG. 1, a lower interlayer oxide layer 2 is disposed on a semiconductor substrate 1, and a digit line 3 is disposed on the lower interlayer oxide layer 2. Although not shown, a MOS transistor is disposed between the lower interlayer oxide layer 2 and the semiconductor substrate 1.

An intermediate interlayer oxide layer 4 covering the digit line 3 and the lower interlayer oxide layer 2 is disposed on the semiconductor substrate 1. A lower contact plug 5 is disposed adjacent to one side of the digit line 3 to pass through the intermediate and lower interlayer oxide layers 4 and 2 and contact with the semiconductor substrate 1. The lower contact plug 5 is laterally spaced apart from the digit line 3. The lower contact plug 5 is electrically connected to source/drain regions of the MOS transistor (not shown).

A lower electrode 6 is disposed on the intermediate interlayer oxide layer 4. The lower electrode 6 is electrically connected to the lower contact plug 5, and extends laterally over the digit line 3. The digit line 3 and the lower electrode 6 are insulated from each other by the intermediate interlayer oxide layer 4.

A magnetic tunnel junction pattern 11 is disposed on the lower electrode 6. The magnetic tunnel junction pattern 11 includes a pinning layer 7, a pinned layer 8, an insulating layer 9, and a free layer 10, which are sequentially stacked. A magnetization direction of the pinned layer 8 is pinned in one direction by the pinning layer 7, and the magnetization direction of the free layer 10 may be varied. The magnetic tunnel junction pattern 11 is aligned to overlie the digit line 3.

An upper interlayer oxide layer 12 covers the lower electrode 6 and the magnetic tunnel junction pattern 11. A bit line 14 is disposed on the upper interlayer oxide layer 12 to intersect the digit line 3. The bit line 14 is electrically connected to the magnetic tunnel junction pattern 11 via an upper contact plug 13 passing through the upper interlayer oxide layer 12. The bit line 14 is aligned to overlap the magnetic tunnel junction pattern 11. That is, the magnetic tunnel junction pattern 11 is disposed at a spot where the digit line 3 and the bit line 14 intersect, and is interposed between the digit line 3 and the bit line 14.

To program data in the conventional magnetic memory device, a program voltage is applied to the bit line 14 and the digit line 3. Accordingly, a first magnetic field is generated around the digit line 3, and a second magnetic field is generated around the bit line 14. A magnetic field produced by vector production of the first and second magnetic fields is selectively applied to the magnetic tunnel junction pattern 11. Accordingly, the magnetization direction of the free layer 10 included in the magnetic tunnel junction pattern 11 is changed. Here, the magnetization direction of the pinned layer 8 is pinned by the pinning layer 7. As a result, the free layer 10 and the pinned layer 8 may have the same magnetization direction or the opposite magnetization directions. In this manner, the magnetic tunnel junction pattern 11 may store data of logic "1" or logic "0".

The alignment between the bit line 4, the digit line 3, and the magnetic tunnel junction pattern 11 is crucial to selectively applying a constant magnetic field to the magnetic tunnel junction pattern 11 of the conventional magnetic memory device. For this reason, the alignment between the digit line 3 and the magnetic tunnel junction pattern 11, and the alignment between the magnetic tunnel junction pattern 11 and the bit line 14 are very carefully performed. As a result, a process of fabricating the magnetic memory device may become very difficult and complicated. Also, the high integration of the magnetic memory device cannot be easily achieved because sufficient alignment margins should be secured due to the several alignment operations.

Also, peripheral circuits are needed to drive the digit line 3, thereby making it more difficult to fabricate a highly integrated magnetic memory device. Also, because a program voltage through the digit line 3 is required during a program operation, the magnetic memory device increases power consumption.

In addition, the digit line 3 should be disposed under the magnetic tunnel junction pattern 11. Thus, the lower contact plug 5 laterally spaced apart from the magnetic tunnel junction pattern 11 is needed to secure a path of a current flowing through the magnetic tunnel junction pattern 11. As a result, a planar area of a magnetic memory cell may be extended.

Further, if the planar area of the free layer 10 is reduced to effect high integration of a semiconductor device, data stored in layer 10 may be lost due to a super-paramagnetic limit. For this reason, it may not be easy to reduce the planar area of the free layer 10, which consequently makes it more difficult to achieve dense integration of the magnetic memory device.

Accordingly, a need remains for a magnetic memory device and a method of fabricating the same capable of solving the aforementioned problems and other problems.

SUMMARY OF THE INVENTION

The present invention provides a magnetic memory device optimized for high integration and a method of fabricating the same.

Further, the present invention provides a magnetic memory device capable of reducing power consumption and a method of fabricating the same.

Embodiments of the present invention provide a magnetic memory device including an invariable pinning pattern and a variable pinning pattern on a substrate. The term "pattern" as used herein refers to one or more patterned layers. A tunnel barrier pattern is interposed between the invariable pinning pattern and the variable pinning pattern, and a pinned pattern is interposed between the invariable pinning pattern and the tunnel barrier pattern. The pinned pattern has a magnetization direction pinned by the invariable pinning pattern. A storage free pattern is interposed between the tunnel barrier pattern and the variable pinning pattern, and a guide free pattern is interposed between the storage free pattern and the variable pinning pattern. A free reversing pattern is interposed between the storage and guide free patterns. The free reversing pattern reverses a magnetization direction of the storage free pattern and a magnetization direction of the guide free pattern in the opposite directions.

In some embodiments, the device may further include a high resistance pattern contacting the variable pinning pattern. Here, the variable pinning pattern includes a first surface contacting with the guide free pattern, and a second surface opposite to the first surface. The high resistance pattern contacts the second surface of the variable pinning pattern.

In other embodiments of the present invention, the invariable pinning pattern may pin a magnetization direction of the pinned pattern during a read operation and a program operation. Also, the variable pinning pattern may pin a magnetization direction of the guide free pattern during the read operation, but may not pin the magnetization direction of the guide free pattern during the program operation. A maximum temperature at which a magnetization pinning force of the invariable pinning pattern is maintained may be higher than a maximum temperature at which a magnetization pinning force of the variable pinning pattern is maintained. The invariable pinning pattern may be formed of a first antiferromagnetic substance, and the variable pinning may be formed of a second antiferromagnetic substance having a blocking temperature lower than that of the first antiferromagnetic substance. The blocking temperature is a maximum temperature at which an exchange coupling force of an antiferromagnetic substance is maintained, and the exchange coupling force corresponds to the magnetization pinning force. The invariable pinning pattern and the variable pinning pattern may be formed of an antiferromagnetic substance, and the invariable pinning pattern may be thicker than the variable pinning pattern.

In further embodiments, electrons within a first program current may flow from the invariable pinning pattern to the variable pinning pattern. The first program current arranges in the same direction, a magnetization direction of a portion of the pinned pattern adjacent to the tunnel barrier pattern and a magnetization direction of the storage free pattern. And, electrons within a second program current may flow from the variable pinning pattern to the invariable pinning pattern. The second program current arranges in the opposite directions, the magnetization direction of a portion of the pinned pattern adjacent to the tunnel barrier pattern and the magnetization direction of the storage free pattern.

In other embodiments, the storage free pattern may be thicker than the guide free pattern.

In yet other embodiments, the pinned pattern may include a first magnetic pattern; a second magnetic pattern; and a pinned reversing pattern interposed between the first and second magnetic patterns. The pinned reversing pattern reverses magnetization directions of the first and second magnetic patterns in the opposite directions. The first magnetic pattern contacts with the invariable pinning pattern so that the magnetization direction thereof is pinned by the invariable pinning pattern. The magnetization direction of the second magnetic patterns is pinned in the opposite direction to the pinned magnetization direction of the first magnetic pattern by the pinned reversing pattern, and the second magnetic pattern contacts with the tunnel barrier pattern.

In further embodiments, the invariable pinning pattern, the pinned pattern, the tunnel barrier pattern, the storage free pattern, the free reversing pattern, the guide free pattern, and the variable pinning pattern may be stacked sequentially on the substrate. Alternatively, the variable pinning pattern, the guide free pattern, the free reversing pattern, the storage free pattern, the tunnel barrier pattern, the pinned pattern, and the invariable pinning pattern may be stacked sequentially on the substrate.

In yet further embodiments of the present invention, a method of forming a magnetic memory device include the following operations. An invariable pinning pattern and a variable pinning pattern are formed on a substrate. A tunnel barrier pattern is formed between the invariable pinning pattern and the variable pinning pattern. A pinned pattern is formed between the invariable pinning pattern and the tunnel barrier pattern, and a magnetization direction of the pinned pattern is pinned by the invariable pinning pattern. A storage free pattern is formed between the tunnel barrier pattern and the variable pinning pattern. A guide free pattern is formed between the storage free pattern and the variable pinning pattern. A free reversing pattern is formed between the storage and guide free patterns. The free reversing pattern reverses a magnetization direction of the storage free pattern and a magnetization direction of the guide free pattern in the opposite directions.

In other embodiments, the method further includes forming a high resistance pattern contacting with the variable pinning pattern. Here, the variable pinning pattern includes a first surface contacting with the guide free pattern, and a second surface opposite to the first surface. The high resistance pattern is formed to contact with the second surface of the variable pinning pattern. The invariable pinning pattern may pin a magnetization direction of the pinned pattern during a read operation and a program operation. The variable pinning pattern may pin a magnetization direction of the guide free pattern during the read operation, and may not pin the magnetization direction of the guide free pattern during the program operation.

The foregoing and other features and advantages of the invention will become more readily apparent from the following detailed description.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principles of the invention. In the drawings.

DETAILED DESCRIPTION

Figure 1:
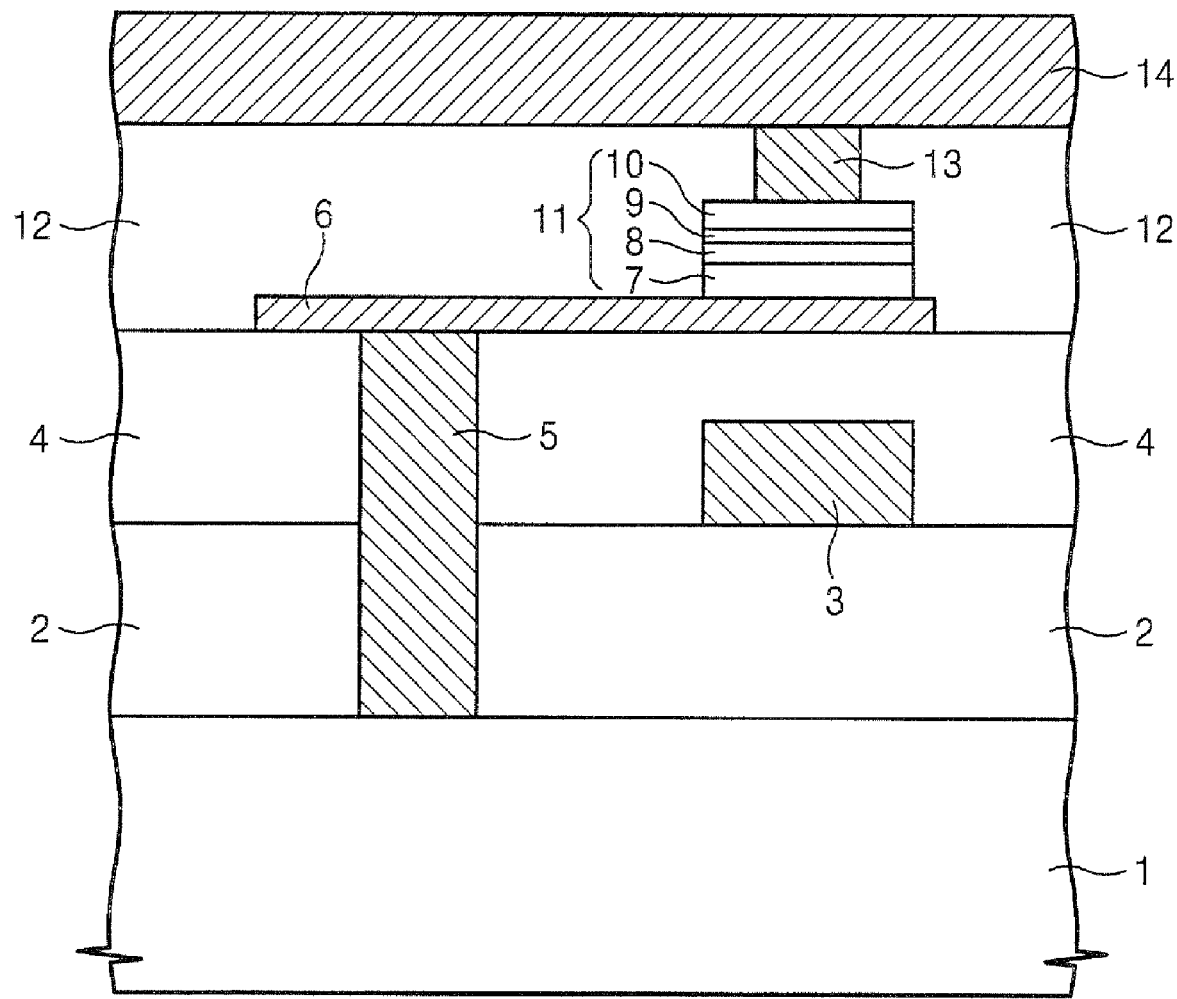
FIG. 1 is a cross-sectional view of a conventional magnetic memory device.

Reference will now be made in detail to the preferred embodiments of the present invention, examples of which are illustrated in the accompanying drawings. However, the present invention is not limited to the embodiments illustrated herein after, and the embodiments herein are rather introduced to provide easy and complete understanding of the scope and spirit of the present invention. In the drawings, the thicknesses of layers and regions are exaggerated for clarity. It will also be understood that when a layer is referred to as being "on" or "over" another layer or substrate, it can be directly on the other layer or substrate, or intervening layers may also be present. Like reference numerals in the drawings denote like elements, and thus their description will be omitted.

Figure 2:
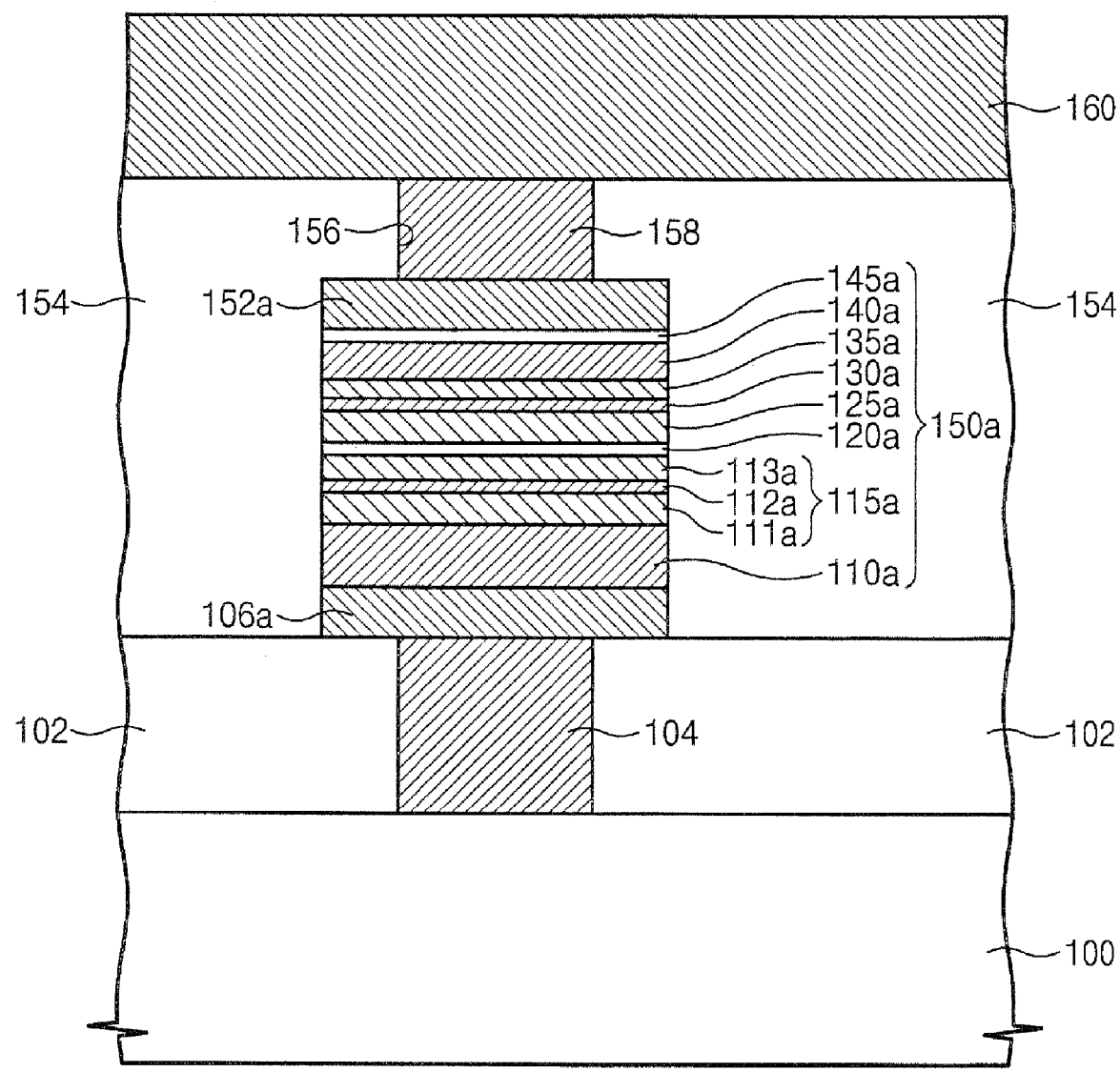
FIG. 2 is a cross-sectional view of a magnetic memory device according to an embodiment of the present invention.

FIG. 2 is a cross-sectional view illustrating a magnetic memory device according to an embodiment of the present invention.

Referring to FIG. 2, a lower insulating layer 102 is disposed on a semiconductor substrate 100 (hereinafter, referred to as a substrate), and a lower contact plug 104 passes through the lower insulating layer 102 and thus is electrically connected to the substrate 100. The lower insulating layer 102 may be formed of a silicon oxide layer, or the like. The lower contact plug 104 may contain at least one conductive material selected from a group consisting of doped polysilicon, metal (e.g., tungsten, molybdenum, etc.), conductive nitride metal (e.g., titanium nitride, tantalum nitride, etc.) and metal silicide (e.g., tungsten silicide, cobalt silicide, etc.). The lower contact plug 104 may be electrically connected to one source/drain region of a MOS transistor (not shown) formed in the substrate 100 and covered with the lower insulating layer 102. A gate electrode of the MOS transistor is connected to a word line (not shown) extending in one direction.

A lower electrode 106a, a magnetic tunnel junction pattern 150a, and an upper electrode 152a are sequentially stacked on the lower insulating layer 102. The lower electrode 106a contacts and is electrically connected to an upper surface of the lower contact plug 104. The lower electrode 106a, the magnetic tunnel junction pattern 150a, and the upper electrode 152a may have sidewalls aligned with respect to one another. Preferably, the lower and upper electrodes 106a and 152a contain a conductive material having very low reactivity. For example, the lower and upper electrodes 106a and 152a may contain titanium nitride, tantalum nitride, tungsten nitride, or the like.

The magnetic tunnel junction pattern 150a includes an invariable pinning pattern 110a and a variable pinning pattern 140a. A tunnel barrier pattern 120a is interposed between the invariable pinning pattern 110a and the variable pinning pattern 140a. A pinned pattern 115a is interposed between the invariable pinning pattern 110a and the tunnel barrier pattern 120a. The invariable pinning pattern 110a pins the magnetization direction of the pinned pattern 115a, and the pinned pattern 115a contacts with the invariable pinning pattern 110a and the tunnel barrier pattern 120a.

The pinned pattern 115a contains a magnetic substance, and a magnetization direction of the pinned pattern 115a is pinned by the invariable pinning pattern 110a. The pinned pattern 115a preferably contains a ferromagnetic substance. The magnetization direction is pinned in one direction at a portion of the pinned pattern 115a adjacent to the tunnel barrier pattern 120a. The entire area of the pinned pattern may be formed of one ferromagnetic substance. In this case, the magnetization direction of the entire area of the pinned pattern 115a is pinned in one direction. Alternatively, at the portion of the pinned pattern 115a adjacent to the invariable pinning pattern 110a, the magnetization direction may be pinned in the opposite direction to the magnetization direction of its portion adjacent to the tunnel barrier pattern 120a.

The tunnel barrier pattern 120a is formed of an insulating material. For example, the tunnel barrier pattern 120a may be formed of aluminum oxide, magnesium oxide, etc. The tunnel barrier pattern 120a preferably has a thickness small enough to allow tunneling of electrons. For example, the tunnel barrier pattern 120a may be formed with a thickness of a few to tens of angstroms.

A storage free pattern 125a is interposed between the tunnel barrier pattern 120a and the variable pinning pattern 140a. The storage free pattern 125a preferably contacts with the tunnel barrier pattern 120a. A guide free pattern 135a is interposed between the storage free pattern 125a and the variable pinning pattern 140a. Preferably, the guide free pattern 135a contacts the variable pinning pattern 140a. A free reversing pattern 130a is interposed between the storage free pattern 125a and the guide free pattern 135a. The free reversing pattern 130a has two opposite first and second surfaces, and the first and second surfaces of the free reversing pattern 130a contact with the storage free pattern 125a and the guide free pattern 135a, respectively.

Preferably, the storage free pattern 125a is thicker than the guide free pattern 135a. The storage and guide free patterns 125a and 135a contain magnetic substances. Particularly, the storage and guide free patterns 125a and 135a preferably contain ferromagnetic substances.

For example, the storage and guide patterns 125a and 135a each may include at least one ferromagnetic material selected from the group consisting of Fe, Co, Ni, Gd, Dy, MnAs, MnBi, MnSb, CrO2, MnOFe2O3, FeOFe2O3, NiOFe2O3, CuOFe2O3, MgOFe2O3, EuO, Y3Fe5O12, etc. Besides, the storage and guide free patterns 125a and 135a may be formed of a material made by adding boron (B) to the ferromagnetic substance. Boron may make a ferromagnetic substrate amorphous. The storage and guide patterns 125a and 135a may be formed of different ferromagnetic substances or of the same ferromagnetic substance.

The magnetization direction of the storage free pattern 125a may be varied. The resistance of the magnetic tunnel junction pattern 150a is varied according to the magnetization direction of the storage free pattern 125a. That is, a first resistance value in the case where the magnetization directions of the storage free pattern 125a and of a portion of the pinned pattern 115a adjacent to the tunnel barrier pattern 120 are arranged in the same direction is smaller than a second resistance value in the case where the magnetization directions thereof are opposite to each other. The magnetic tunnel junction pattern 150a stores data of logic "1" or logic "0" according to the resistance values.

The free reversing pattern 130a has a magnetization reversing force that reverses the magnetization directions of the storage free pattern 125a and the guide free pattern 135 in the opposite directions. Accordingly, the magnetization direction of the guide free pattern 135a and the magnetization direction of the storage free pattern 125a are arranged in the opposite directions by the free reversing pattern 130a. The free reversing pattern 130a is preferably formed of a conductive material having the magnetization reversing force. For example, the free reversing pattern 130a may contain ruthenium (Ru), iridium (Ir), rhodium (Rh), etc. As the magnetization direction of the storage free pattern 125a is changed, the magnetization direction of the guide free pattern 135a is also changed. Also, the magnetization direction of the guide free pattern 135a may be pinned by the variable pinning pattern 140a under predetermined conditions.

The variable pinning pattern 140a pins the magnetization direction of the guide free pattern 135a during a read operation of a magnetic memory cell. The variable pinning pattern 140a does not pin the magnetization direction of the guide free pattern 135a during a program operation of the magnetic memory cell. Also, the invariable pinning pattern 110a pins the magnetization direction of the pinned pattern 115a during both read and program operations.

The invariable pinning pattern 110a has a magnetization pinning force that pins the magnetization direction of the pinned pattern 115a. Under predetermined conditions, the variable pinning pattern 140a has a magnetization pinning force that pins the magnetization direction of the guide free pattern 135a. The magnetization pinning force is defined as a force pinning a magnetization direction of an adjacent magnetic substance.

Preferably, a first maximum temperature at which the magnetization pinning force of the invariable pinning pattern 110a is higher than a second maximum temperature at which the magnetization pinning force of the variable pinning pattern 140a is maintained. The properties of the invariable pinning and variable pinning patterns 110a and 140a may be obtained by using differences in the maximum temperatures at which the magnetization pinning forces are maintained.

Heat of a program temperature is supplied to the magnetic tunnel junction pattern 150a during the program operation. Here, the program temperature is preferably between the first maximum temperature and the second maximum temperature. Accordingly, during the program operation, the invariable pinning pattern 110a maintains a magnetization pinning force while the variable pinning pattern 140a loses the magnetization pinning force. As a result, during the program operation, the invariable pinning pattern 110a pins the magnetization direction of the pinned pattern 115a while the variable pinning pattern 140a does not pin the magnetization direction of the guide free pattern 135a. Because heat of the program temperature is not supplied during the read operation, both invariable pinning and variable pinning patterns 110a and the 140a maintain the magnetization pinning forces, thereby pinning the magnetization directions of the pinned pattern 115a and the guide free pattern 135a, respectively.

Preferably, the invariable pinning and variable pinning patterns 110a and 140a are formed of an antiferromagnetic substance. Here, preferably, the invariable pinning pattern 110a is formed of a first antiferromagnetic substance, and the variable pinning pattern 140a is formed of a second antiferromagnetic substance having a lower blocking temperature than that of the first antiferromagnetic substance. The blocking temperature is a maximum temperature at which an exchange coupling force of an antiferromagnetic substance can be maintained. The exchange coupling force pins a magnetization direction of a magnetic substances contacting with an anti ferromagnetic substance and corresponds to the magnetization pinning force.

The blocking temperature of platinum manganese (PtMn) is higher than the blocking temperatures of iridium manganese (IrMn), and iron manganese (FeMn). Also, the blocking temperature of IrMn is higher than that of the FeMn. Accordingly, for example, the invariable pinning pattern 110a may be formed of PtMn, and the variable pinning pattern 140a may be formed of IrMn or FeMn. Also, the invariable pinning pattern 110a and the variable pinning pattern 140a may be formed of IrMn and FeMn, respectively. Of course, the invariable pinning pattern 110a may be formed of a different antiferromagnetic substance, and the variable pinning pattern 110a may be formed of another different antiferromagnetic substance having a blocking temperature lower than that of the invariable pinning pattern 110a.

An antiferromagnetic layer may change in the blocking temperature according to its thickness. Using this property, the invariable pinning pattern 110a may be formed thicker than the variable pinning pattern 140 while the invariable pinning and variable pinning patterns 110a and 140a are formed of an antiferromagnetic substance. Accordingly, the blocking temperature of the invariable pinning pattern 110a is higher than the blocking temperature of the variable pinning pattern 140a.

Besides, the invariable pinning pattern 110a and the variable pinning pattern 140a may be formed by using antiferromagnetic substances having different blocking temperatures and using changes in blocking temperature according to the thickness of an antiferromagnetic substance (i.e., the blocking temperature increases as the thickness is greater). In other words, the invariable pinning pattern 110a is formed of a first antiferromagnetic substance, and the variable pinning pattern 140a is formed of a second antiferromagnetic substance having a blocking temperature lower than that of the first antiferromagnetic substance. The first antiferromagnetic substance may be formed thicker than the second antiferromagnetic substance.

As described above, the free reversing pattern 130a has a magnetization reversing force. Here, the maximum temperature at which the magnetization reversing force of the free reversing pattern 130a is maintained is preferably higher than the program temperature. Accordingly, the magnetization reversing force of the free reversing pattern 130a is maintained during the program operation to thereby change the magnetization direction of the storage free pattern 125a, and thus the magnetization direction of the guide free pattern 135a is reversed to be opposite to the magnetization direction of the storage free pattern 125a. Particularly, the maximum temperature at which the magnetization reversing force of the free reversing pattern 130a is maintained may be higher than the first maximum temperature of the invariable pinning pattern 110a.

The pinned pattern 115a may include a first magnetic pattern 111a, a second magnetic pattern 113a, and a pinned reversing pattern 112a interposed between the first and second magnetic patterns 111a and 113a. Preferably, the first magnetic pattern 111a contacts with the invariable pinning pattern 110a, and the second magnetic pattern 113a contacts with the tunnel barrier pattern 120a. The pinned reversing pattern 112a contacts with the first and second magnetic patterns 111a and 113a.

The magnetization direction of the first magnetic pattern 111a is pinned by the invariable pinning pattern 120a. The magnetization direction of the first magnetization pattern 111a is pinned by the invariable pinning pattern 120 during both read and program operations. The pinned reversing pattern 112a reverses the magnetization directions of the first and second magnetic patterns 111a and 113a in the opposite directions. Accordingly, the magnetization direction of the second magnetic pattern 113a is pinned in the opposite direction to the magnetization direction of the first magnetic pattern 111a by the pinned reversing pattern 112a. The magnetization direction of the second magnetic pattern 113a is pinned during both read and program operations.

Preferably, the first and second magnetic patterns 111a and 113a are formed of a ferromagnetic substance. For example, the first and second magnetic patterns 111a and 113a may be formed of at least one ferromagnetic substance selected from the group consisting of Fe, Co, Ni, Gd, Dy, MnAs, MnBi, MnSb, CrO2, MnOFe2O3, FeOFe2O3, NiOFe2O3, CuOFe2O3, MgOFe2O3, EuO, Y3Fe5O12, etc. Besides, the first and second magnetic patterns 111a and 113a may be formed of a material made by adding boron (B) to the ferromagnetic substance. The first and second magnetic patterns 111a and 113a may be formed of the same material or of different materials. The pinned reversing pattern 112a is preferably formed of a conductive material having a magnetization reversing force. For example, the pinned reversing pattern 112a may contain ruthenium (Ru), iridium (Ir), rhodium (Rh), etc.

The variable pinning pattern 140a has a first surface contacting the guide free pattern 135a and a second surface opposite to the first surface. Here, the magnetic tunnel junction pattern 150a may further include a high resistance pattern 145a contacting the second surface of the variable pinning pattern 140a. The high resistance pattern 145a is formed of a material with high resistance. Predetermined currents may flow through the high resistant pattern 145a. For example, the high resistance pattern 145a may be formed of a material containing oxygen and material elements contained in the variable pinning pattern 140a. That is, the high resistance pattern 145a may be formed by oxidizing the surface of the variable pinning pattern 145a. Of course, the high voltage pattern 145a may be formed of a different high resistance material. Preferably, the high resistance pattern 145 has a very thin thickness of a few to tens of angstroms.

Referring to FIG. 2, the lowermost portion of the magnetic tunnel junction pattern 150a may be the invariable pinning pattern 110a, and the uppermost portion of the magnetic tunnel junction pattern 150a may be the high resistance pattern 140a. That is, the invariable pinning pattern 110a, the pinned pattern 115a, the tunnel barrier pattern 120a, the storage free pattern 125a, the free reversing pattern 130a, the guide free pattern 135a, the variable pinning pattern 140a, and the high resistance pattern 145a may be sequentially stacked on the lower electrode 106a. In this case, the invariable pinning pattern 110a is electrically connected to the lower contact plug 104 via the lower electrode 106a, and the variable pinning pattern 140a is electrically connected to the upper electrode 152a via the high resistance pattern 145a. The lower electrode 106a may restrict a reaction between the invariable pinning pattern 110a and the lower insulating layer 102, and the upper electrode 152a may protect the high resistance pattern 145a. If the high resistance pattern 145a is omitted, the upper electrode 152a may contact with the variable pinning pattern 140a.

An upper insulating layer 154 covers an entire surface of the substrate 100. The upper insulating layer 154 covers the lower insulating layer 102, the lower electrode 106a, the magnetic tunnel junction pattern 150a, and the upper electrode 152a. The upper insulating layer 154 may be formed of a silicon oxide layer.

An upper contact plug 158 fills a contact hole 156 passing through the upper insulating layer 154 and exposing the upper electrode 152a. A line 160 contacting with the upper contact plug 158 is disposed on the upper insulating layer 154. The line 160 is electrically connected to the magnetic tunnel junction pattern 150a via the upper contact plug 158 and the upper electrode 152a. The line 160 corresponds to a bit line. The line 160 may be disposed across the word line (not shown).

The upper contact plug 158 may be omitted, and the line 160 may extend downward to fill the contact hole 156. Alternatively, an upper surface of the upper insulating layer 154 may be flattened as high as an upper surface of the upper electrode 152a to expose the upper electrode 152a, and the line 160 may contact directly the exposed upper electrode 152a.

The upper contact plug 158 and the line 160 contain a conductive material. For example, the upper contact plug 158 and the line 160 each may contain at least one conductive material selected from the group consisting of doped polysilicon, metal (e.g., tungsten, molybdenum, etc.), conductive nitride metal (e.g., titanium nitride, tantalum nitride, etc.) and metal silicide (e.g., tungsten silicide, cobalt silicide, etc.). The upper contact plug 158 and the line 160 may be formed of the same conductive material or of different conductive materials.

A program operation with respect to the magnetic memory device having the aforedescribed structure may be divided into a first program operation and a second program operation. The first program operation is defined as an operation of arranging in the same direction, a magnetization direction of a portion of the pinned pattern 110a adjacent to the tunnel barrier pattern 120a and a magnetization direction of the storage free pattern 125a. That is, the first program operation corresponds to an operation of converting a state of the magnetic tunnel junction pattern 150a into a low resistance state. The second program operation is defined as an operation of arranging in opposite directions, the magnetization direction of a portion of the pinned pattern 110a adjacent to the tunnel barrier pattern 120a and the magnetization direction of the storage free pattern 125a. That is, the second program operation corresponds to an operation of converting a state of the magnetic tunnel junction pattern 150a into a high resistance state. The first and second program operations will now be described with reference to accompanying drawings.

Figure 3A:
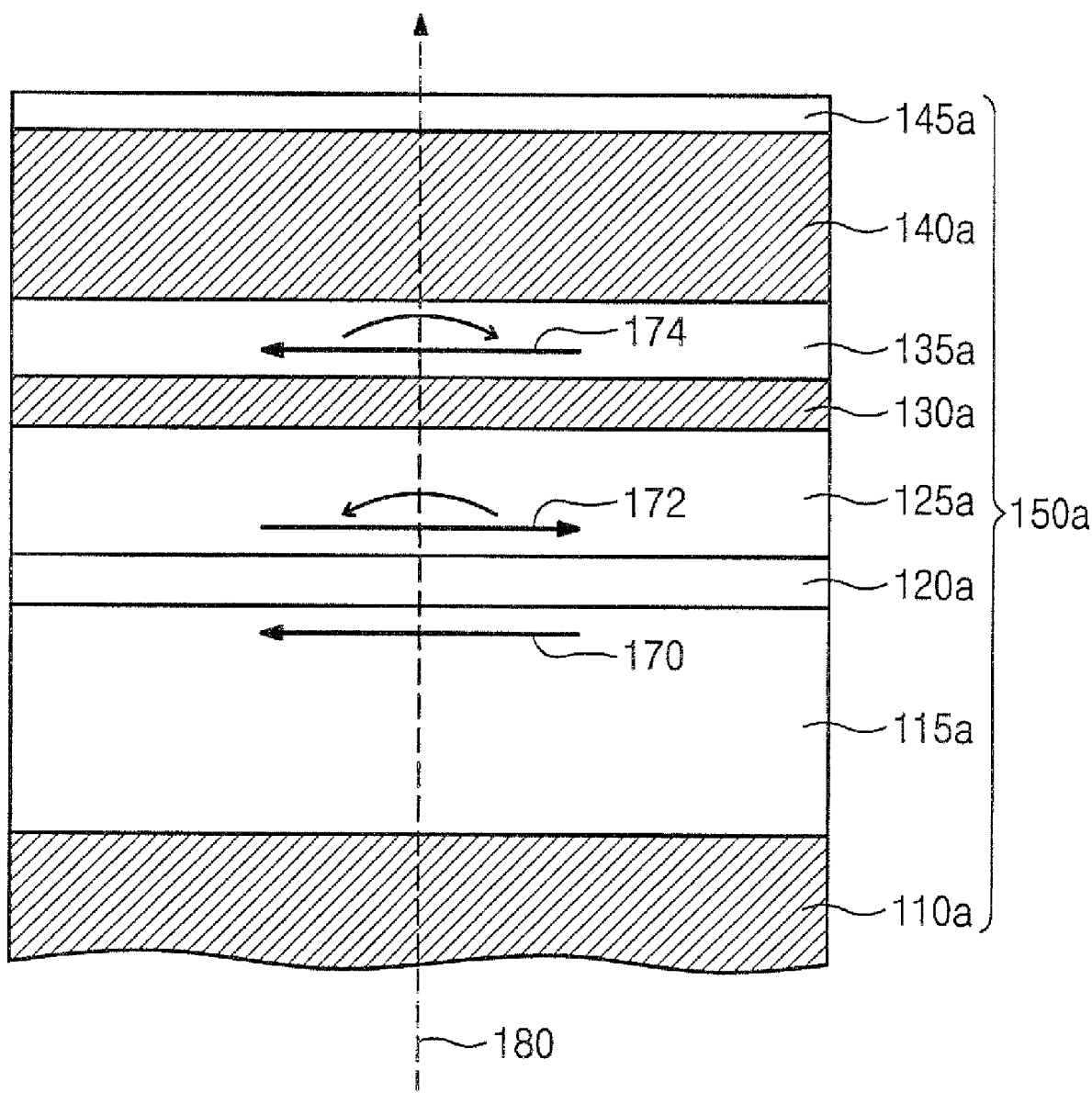
FIGS. 3A and 3B are cross-sectional views illustrating a first program method of a magnetic memory device according to an embodiment of the present invention.
Figure 3B:
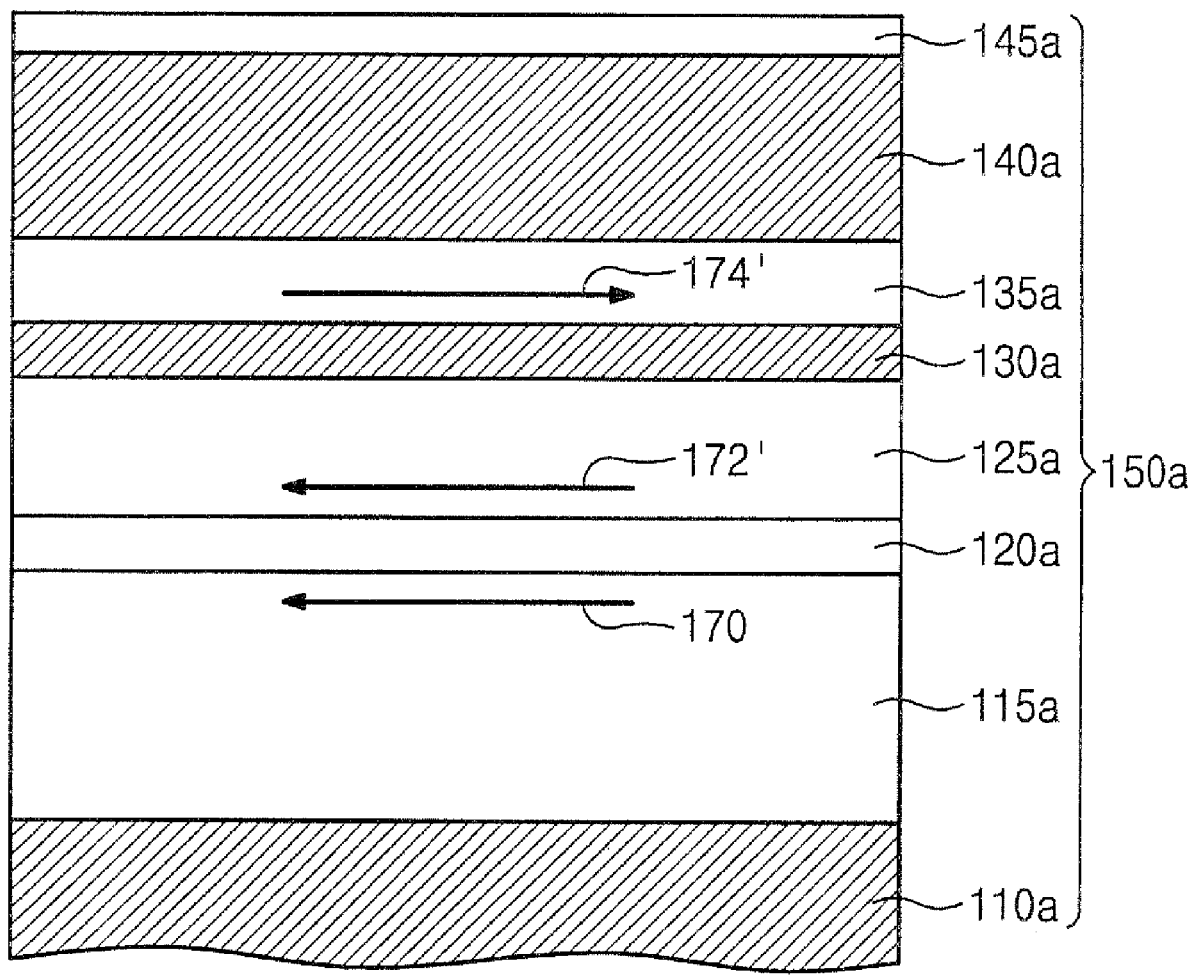

FIGS. 3A and 3B are cross-sectional views for describing the first program method of a magnetic memory device according to an embodiment of the present invention.

Referring to FIGS. 3A and 3B, a magnetization direction 170 of a portion of the pinned pattern 115a adjacent to the tunnel barrier pattern 120a is pinned in a first direction. A magnetization direction 172 of the storage free pattern 125a is arranged in a second direction opposite to the first direction. Here, a magnetization direction 174 of the guide free pattern 135a is arranged in the first direction opposite to the magnetization direction 172 of the storage free pattern 125a. The first program operation of converting the magnetization direction 172 of the storage free pattern 125a into the first direction will now be described.

At the time of the first program operation, a first program current is flowed to the magnetic tunnel junction pattern 150. The flow 180 of electrons within the first program current (hereinafter, referred to the flow of first electrons) proceeds to the variable pinning pattern 140a from the invariable pinning pattern 110a. That is, the first program current flows from the variable pinning pattern 140a to the invariable pinning pattern 110a. Joule's heat is generated at the tunnel barrier pattern 120a by the first program current. The Joule's heat corresponds to heat of a program temperature. As described above, the program temperature is lower than the maximum temperature at which the magnetization pinning force of the invariable pinning pattern 110a is maintained, and is higher than the maximum temperature at which the magnetization pinning force of the variable pinning pattern 140a is maintained. Accordingly, during the first program operation, the invariable pinning pattern 110a maintains the magnetization pinning force while the variable pinning pattern 140a loses the magnetization pinning force. As a result, the invariable pinning pattern 140a pins the magnetization direction of the pinned pattern 115a but does not pin the magnetization direction 174 of the guide free pattern 135a. The Joule's heat is generated even from the high resistance pattern 145a. The high resistance pattern 145a may perform a supplementary role in supplying heat of the program temperature. In this case, the heat of the program temperature is supplied by the high resistance pattern 145a as well as by the tunnel barrier pattern 120a. Because of the high resistance pattern 145a, heat of the program temperature can be more easily supplied to the variable pinning pattern 140a. Of course, even if the high resistance pattern 145a is omitted, the tunnel barrier pattern 120a can still supply heat of the program temperature.

Electrons passing through the pinned pattern 115a and tunneling through the tunnel barrier pattern 120a by the flow 180 of the first electrons include first large-numbered electrons and first small-numbered electrons. The first large-numbered electrons have spins in the first direction identical to the magnetization direction 170 of the pinned pattern 115a. The first small-numbered electrons may have spins in the second reaction opposite to the magnetization direction 170 of the pinned pattern 115a. The amount of the first large-numbered electrons is much larger than the amount of the first small-numbered electrons. Thus, a large amount of the first large-numbered electrons exist within the storage free pattern 125a. As a result, the magnetization direction 172 (refer to FIG. 3A) of the storage free pattern 125a is changed to the first direction identical to the magnetization direction 170 of the pinned pattern 115a by receiving torque due to the spins of the first large-numbered electrons in the first direction. The magnetization direction 172' of the storage free pattern 125a, the first direction, is illustrated in FIG. 3B.

When the magnetization direction 172, the second direction, of the storage free pattern 125a is converted into the magnetization direction 172', the first direction, the magnetization direction 174 (refer to FIG. 3A), the first direction, of the guide free pattern 135a is converted into the magnetization direction 174' (refer to FIG. 3B), the second direction. Because the variable pinning pattern 140a loses the magnetization pinning force at the time of the first program operation, it is possible to change the magnetization direction of the guide free pattern 135a. The storage free pattern 125a is thicker than the guide free pattern 135a. Accordingly, the conversion of the magnetization direction of the storage free pattern 125a is dominant over the conversion of the magnetization direction of the guide free pattern 135a. As a result, the conversion of the magnetization direction of the storage free pattern 125a facilitates the conversion of the magnetization direction of the guide free pattern 135a.

As illustrated in FIG. 3B, the first program operation allows the magnetization direction 170 of the pinned pattern 115a and the magnetization direction 172' of the storage free pattern 125a to be arranged parallel in the same direction.

Then, the second program operation will now be described with reference to FIGS. 4A and 4B.

Figure 4A:
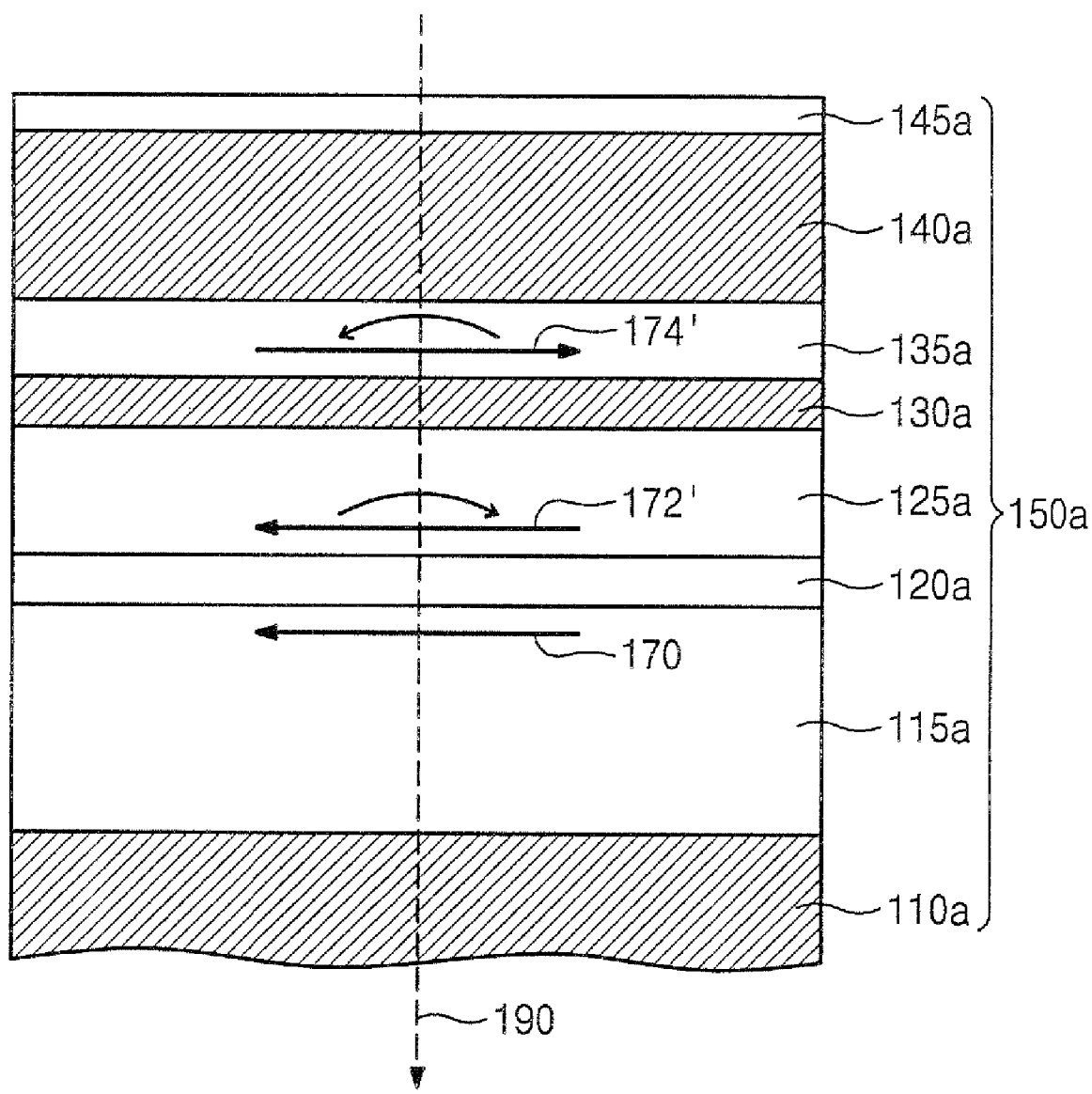
FIGS. 4A and 4B are cross-sectional views illustrating a second program method of a magnetic memory device according to an embodiment of the present invention.
Figure 4B:
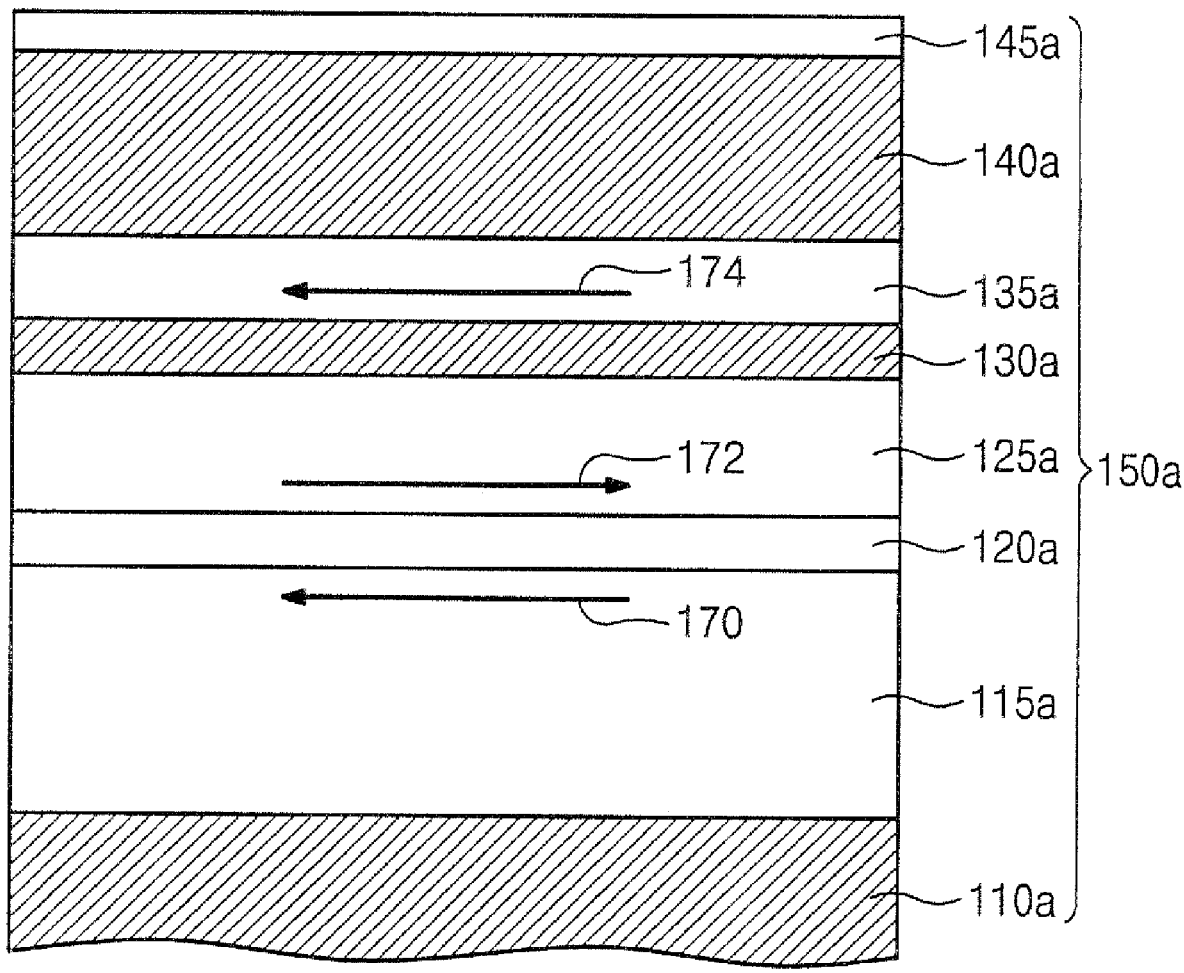

FIGS. 4A and 4B are cross-sectional views for describing a second program method of the magnetic memory device according to an embodiment of the present invention.

Referring to FIGS. 4A and 4B, a second program current is flowed to the magnetic tunnel junction pattern 150a at the time of the second program operation. Here, the flow 190 of electrons within the second program current (hereinafter, referred as the flow of second electrons) proceeds from the variable pinning pattern 140a to the invariable pinning pattern 110a. That is, the second program current flows from the invariable inning pattern 110a to the variable pinning pattern 140a. Heat of the program temperature is generated by the second program current and the tunnel barrier pattern 120a. Accordingly, the variable pinning pattern 140a loses a magnetization pinning force while the invariable pinning pattern 110a maintains the magnetization pinning force. Joule's heat is generated at the high voltage pattern 145 to thus supplement heat of the program temperature.

Electrons flowing via the guide free pattern 135a by the flow 190 of the second electrons include second large-numbered electrons and second small-numbered electrons. The second large-numbered electrons have spins in the same direction as the magnetization direction 174' of the guide free pattern 135a, and the second small-numbered electrons have spins in the opposite direction to the magnetization direction 174' of the guide free pattern 135a. The amount of the second large-numbered electrons is much larger than the amount of the second small-numbered electrons. Accordingly, the second large-numbered electrons having spins in the second direction opposite to the magnetization direction 170 of the pinned pattern 115a exist in large amount in the storage free pattern 125a.

Besides, electrons passing through the storage free pattern 125a include third large-numbered electrons and third small-numbered electrons. The third large-numbered electrons have spins in the same direction as the magnetization direction 172' of the storage free pattern 125a, and the third small-numbered electrons have spins in the opposite direction to the magnetization direction 172' of the storage free pattern 125a. The spins of the third large-numbered electrons are in the same direction as the magnetization direction 170 of the pinned pattern 115a. Thus, most of the third large-numbered electrons smoothly pass through the tunnel barrier pattern 120a and the pinned pattern 115a and flow to the invariable pinning pattern 110a. In contrast, the third small-numbered electrons have spins in the opposite direction to the magnetization direction 170 of the pinned pattern 115a. Accordingly, most of the third small-numbered electrons cannot smoothly pass through the pinned pattern 115a but are stored between the pinned pattern 115a and the storage free pattern 125a. The spin direction of the third small-numbered electrons is the second direction identical to the spin direction of the second large-numbered electrons.

Consequently, the magnetization direction 172' of the storage free pattern 125a is converted into the second direction because of the second large-numbered electrons existing in large amount in the storage free pattern 125a and the third small-numbered electrons accumulated between the pinned pattern 115a and the storage free pattern 125a. Here, the magnetization direction 174' of the guide free pattern 135a is reversed by the free reversing pattern 130a.

FIG. 4A illustrates that the second program operation allows the magnetization direction 172 of the storage free pattern 125a to be arranged in the opposite direction to the magnetization direction 170 of the pinned pattern 115a, and allows the magnetization direction 174 of the guide free pattern 135a to be arranged in the opposite direction to the magnetization direction 172 of the storage free pattern 125a.

A read operation of the magnetic memory device will now be described.

Preferably, the smaller amount of read current than the amount of the first and second program currents is flowed through the magnetic tunnel junction pattern 150a. Thus, the temperature of heat generated by the tunnel barrier pattern 120a and the high resistance pattern 145a due to the read current becomes lower than the maximum temperature at which a magnetization pinning force of the variable pinning pattern 140a is maintained. As a result, the variable pinning pattern 140a pins the magnetization direction of the guide free pattern 135a. The variable pinning pattern 140a maintains the magnetization pinning force even in a wait state of the magnetic memory device as well as during the read operation. Because the variable pinning pattern 140a maintains the magnetization pinning force during the read operation and in the wait state, a super-paramagnetic limit is overcome even though a planar area of the magnetic tunnel junction pattern 150a is reduced, thereby improving the ability to maintain data of the magnetic tunnel junction pattern 150a.

The magnetic memory device of the aforementioned structure does not require the conventional digit line. Accordingly, a peripheral circuit related to the conventional digit line is not required. Also, an increase in area of the magnetic memory cell caused by the conventional digit line may be prevented. As a result, a highly-integrated magnetic memory device can be implemented.

Also, the fine alignment processes are not needed because the conventional digit line need not be used. Accordingly, the method of fabricating the magnetic memory device having the magnetic tunnel junction pattern 150a is very much facilitated, thereby improving productivity.

Furthermore, power consumption related to the conventional digit line is reduced by not requiring the related digit line, so that a magnetic memory device with low power consumption may be implemented.

Besides, the variable pinning pattern 140a pins the magnetization direction of the guide free pattern 135a during the read operation and in the wait state, and the free reversing pattern 130a pins the magnetization direction of the storage free pattern 125a. Thus, a super-paramagnetic limit is overcome, thereby reducing planar area of the magnetic tunnel junction pattern 150a. As a result, a more highly-integrated magnetic memory device may be implemented.

As for the electrical connection between the aforementioned magnetic tunnel junction pattern 150a and the line 160, the variable pinning pattern 140a is electrically connected to the line 160 via the upper electrode 152a. Alternatively, the invariable pinning pattern of the magnetic tunnel junction pattern may be electrically connected to the line used as a bit line. This will now be described with reference to accompanying drawings. In this modified example, like reference numerals in the drawings denote like elements with those of the aforementioned magnetic memory device of FIG. 2.

Figure 5:
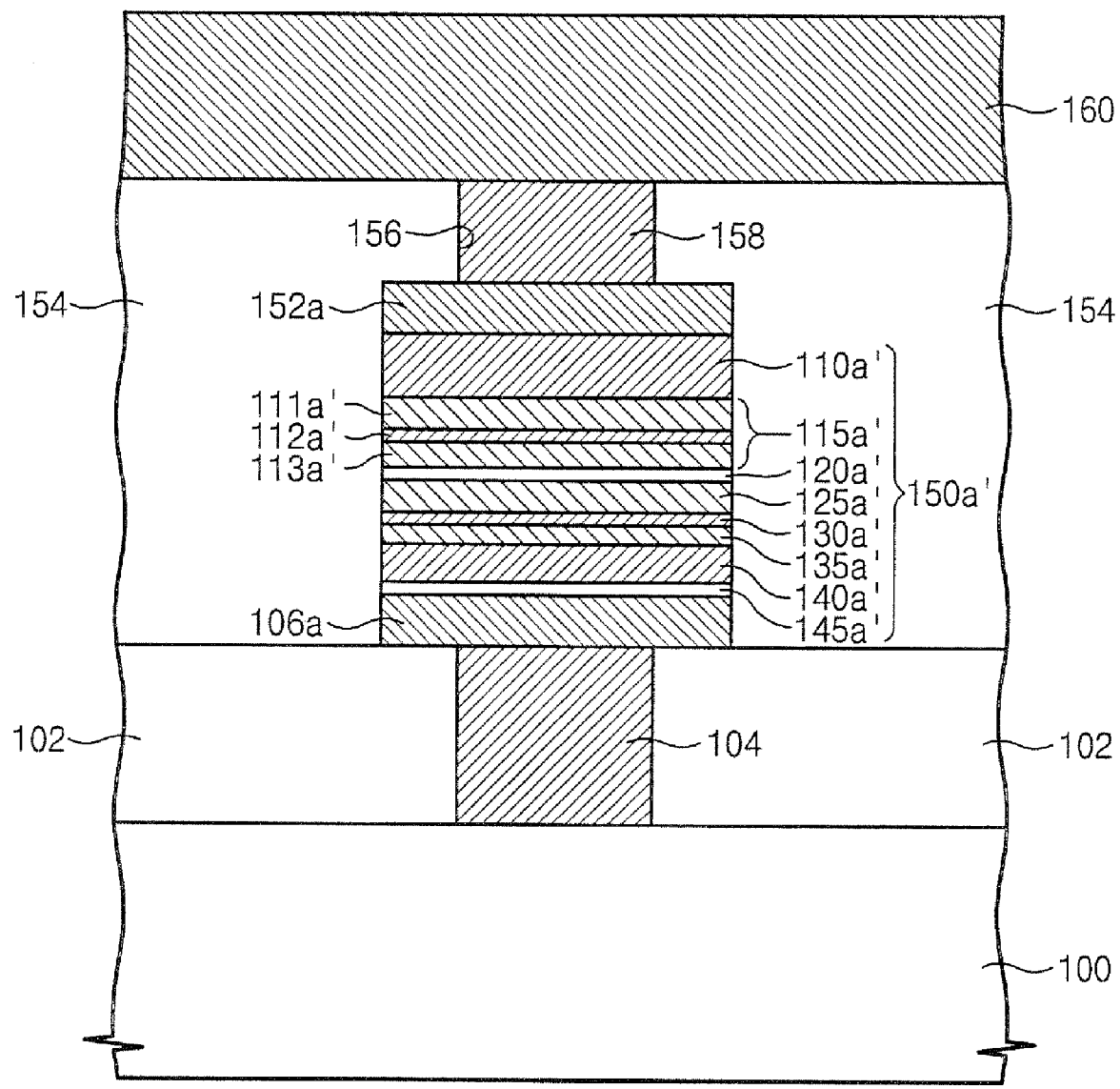
FIG. 5 is a cross-sectional view illustrating a modified example of a magnetic memory device according to an embodiment of the present invention.

FIG. 5 is a cross-sectional view illustrating the modified example of the magnetic memory device according to an embodiment of the present invention.

Referring to FIG. 5, a variable pinning pattern 140a' is disposed on a lower electrode 106a contacting with a lower contact plug 102. A high resistance pattern 145a' may be disposed between the variable pinning pattern 140a' and the lower electrode 106a. A guide free pattern 135a', a free reversing pattern 130a', a storage free pattern 125a', a tunnel barrier pattern 120a', a pinned pattern 115a', and an invariable pinning pattern 110a' are sequentially stacked on the variable pinning pattern 140a'. The pinned pattern 115a' may include a first magnetic pattern 111a' contacting with the invariable pinning pattern 110a', a second magnetic pattern 113a' contacting with the tunnel barrier pattern 120a', and a pinned reversing pattern 112a' interposed between the first and second magnetic patterns 111a' and 113a'. The invariable pinning pattern 110a' is connected to an upper electrode 152a and is electrically connected to a line 160.

The high voltage pattern 145a', the variable pinning pattern 140a', the guide free pattern 135a', the free reversing pattern 130a', the storage free pattern 125a', the tunnel barrier pattern 120a', the pinned pattern 115a' and the invariable pinning pattern 110a', which are sequentially stacked form a magnetic tunnel junction pattern 150a'.

Electrons within a first program current used at the time of a first program operation of a magnetic memory device having the aforementioned structure flow from the invariable pinning pattern 110a' to the variable pinning pattern 140a'. The first program operation is an operation of arranging a magnetization direction of the pinned pattern 115a' and a magnetization direction of the storage free pattern 125a' in the same direction. Electrons within a second program current used at the time of a second program operation of the magnetic memory device flow from the variable pinning pattern 140a' to the invariable pinning pattern 110a'. Here, the second program operation is an operation of arranging the magnetization direction of the pinned pattern 115a' and the magnetization direction of the storage free pattern 125a' in the opposite directions.

The high voltage pattern 145a', the variable pinning pattern 140a', the guide free pattern 135a', the free reversing pattern 130a', the storage free pattern 125a', the tunnel barrier pattern 120a', the pinned pattern 115a', and the invariable pinning pattern 110a' may be formed of the same materials and have the same properties as the high resistance pattern 145a, the variable pinning pattern 140a, the guide free pattern 135a, the free reversing pattern 130a, the storage free pattern 125a, the tunnel barrier pattern 120a, the pinned pattern 115a, and the invariable pinning pattern 110a, respectively.

Furthermore, the high resistance pattern 145a' may be formed of a material containing oxygen and material elements contained in the lower electrode 106a. That is, the high resistance pattern 145a' may be formed by oxidizing a surface of the lower electrode 106a.

The method of forming a magnetic memory device according to an embodiment of the present invention will now be described.

Figure 6:
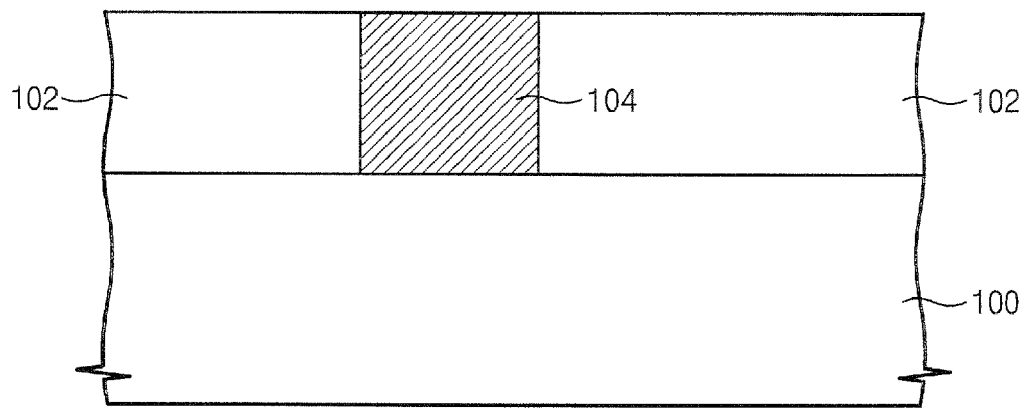
FIGS. 6 through 8 are cross-sectional views illustrating a method of forming a magnetic memory device according to an embodiment of the present invention.
Figure 7:
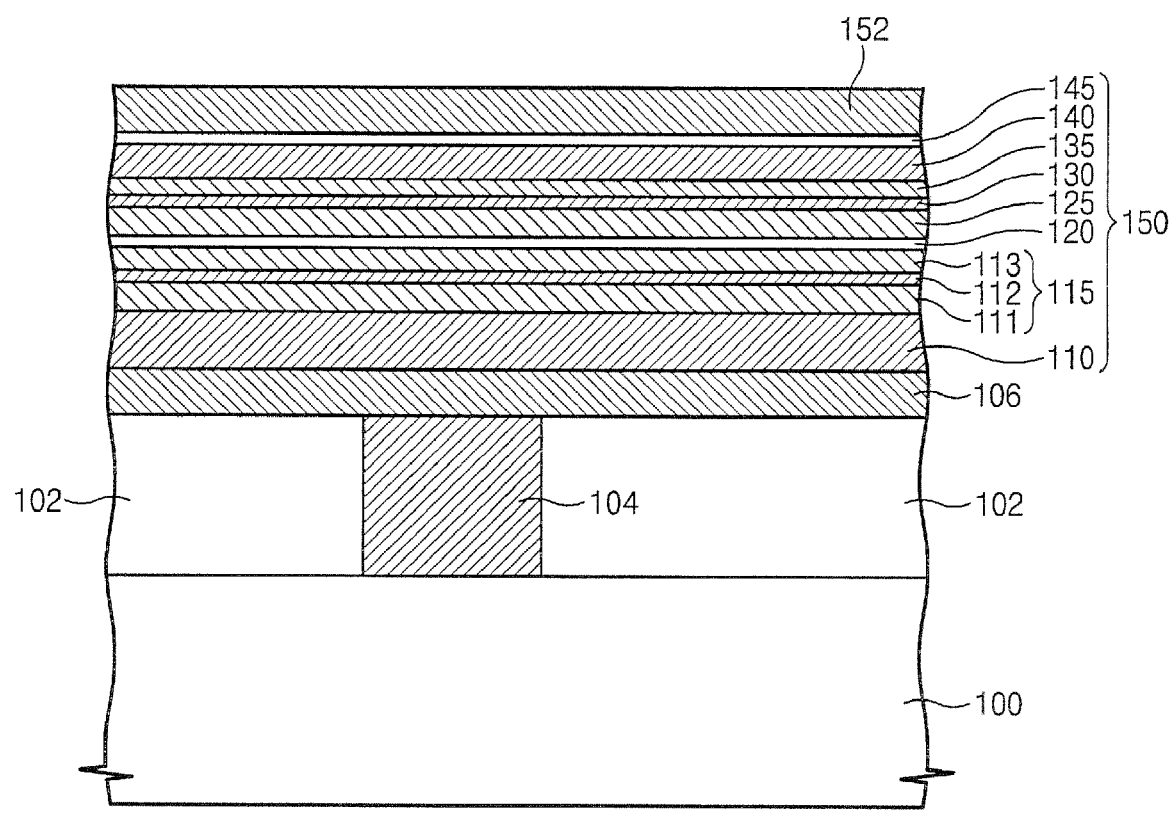
Figure 8:
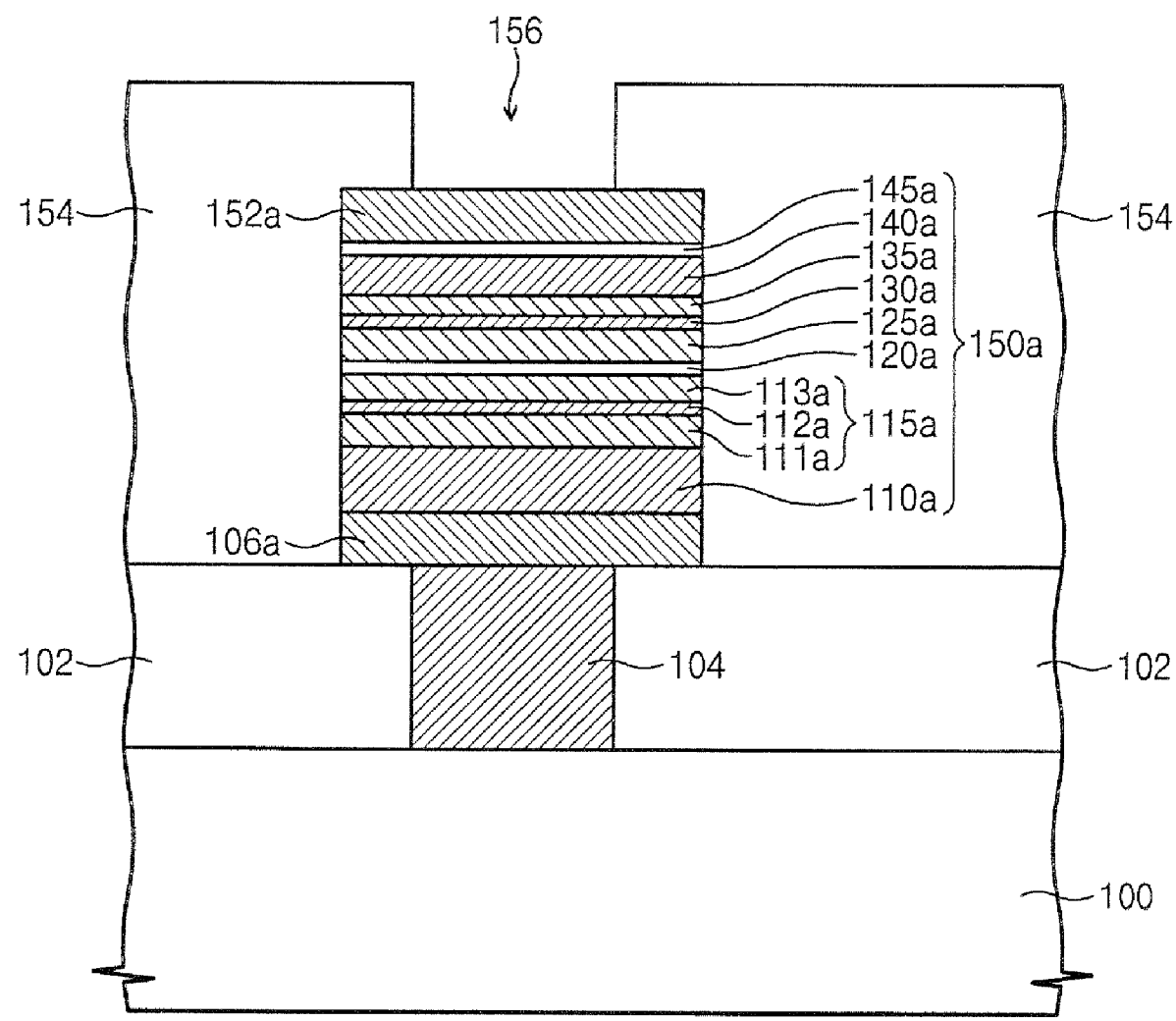

FIGS. 6 through 8 are cross-sectional views for describing a method of forming a magnetic memory device according to an embodiment of the present invention.

Referring to FIG. 6, a lower insulating layer 102 is formed on a substrate 100, and the lower insulating layer 102 is patterned to form a contact hole exposing the substrate 100. A lower contact plug 104 is embedded in the contact hole.

Referring to FIG. 7, a lower conductive layer 106, an invariable pinning layer 110, a pinned layer 115, a tunnel barrier layer 120, a storage free layer 125, a free reversing layer 130, a guide free layer 135, a variable pinning layer 140, a high resistance layer 145, and an upper conductive layer 152 are sequentially formed on an entire surface of the substrate 100 including the lower contact plug 104. The layers 110, 115, 120, 125, 130, 135, 140 and 145 between the lower conductive layer 106 and the upper conductive layer 152 form a magnetic tunnel junction multilayer 150. The pinned layer 115 may include a first magnetic layer 111 contacting with the invariable pinning layer 110, a second magnetic layer 113 contacting with the tunnel barrier layer 120, and a pinned reversing layer 112 interposed between the first and second magnetic layers 111 and 113.

The high resistance layer 145 may be formed by performing an oxidation process on a surface of the variable pinning layer 140. Alternatively, the high resistance layer 145 may be formed of a different high resistance material layer by a chemical vapor deposition (CVD) technology.

Referring to FIG. 8, the upper conductive layer 152, the magnetic tunnel junction multilayer 150, the lower conductive layer 106 are successively patterned, thereby forming a lower electrode 106a, a magnetic tunnel junction pattern 150a, and an upper electrode 152a stacked in the sequential order.

The magnetic tunnel junction pattern 150a includes a invariable pinning pattern 110a, a pinned pattern 115a, a tunnel barrier pattern 120a, a storage free pattern 125a, a free reversing pattern 130a, a guide free pattern 135a, a variable pinning pattern 140a, and a high resistance pattern 145a, which are sequentially stacked. The pinned pattern 115a may include a first magnetic pattern 111a contacting with the tunnel barrier pattern 120a, and a pinned reversing pattern 112a interposed between the first and second magnetic patterns 111a and 113a.

Properties of elements contained in the magnetic tunnel junction pattern 150a, and materials forming them are the same as those described with reference to FIG. 2.

An upper insulating layer 154 is formed on an entire surface of the substrate 100, and the upper insulating layer 154 is patterned to form a contact hole 156 exposing the upper electrode 152a.

Then, an upper contact plug 158 of FIG. 2 is embedded in the contact hole 156, and the line 160 of FIG. 2 contacting with the upper contact plug 158 is formed on the upper insulating layer 154, thereby implementing the magnetic memory device of FIG. 2.

As another method, after the upper insulating layer 154 is flattened or planarized until the upper electrode 152a is exposed, the line 160 of FIG. 2 may be formed to contact with the exposed upper electrode 152a. In this case, the operation of forming the contact hole 156 and the operation of forming the upper contact plug 158 are omitted.

The method of forming the magnetic memory device illustrated in FIG. 5 will next be described. This is similar to the aforedescribed method of forming the magnetic memory device.

Figure 9:
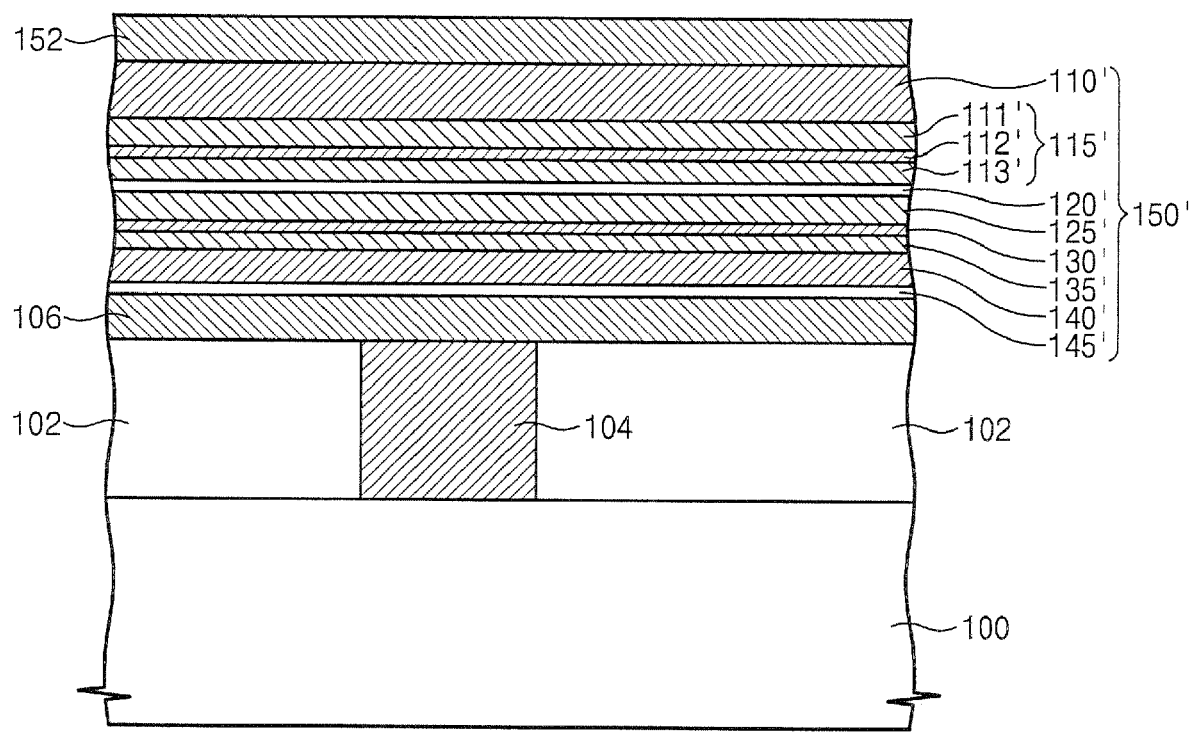
FIG. 9 is a cross-sectional view illustrating a method of forming the magnetic memory device illustrated in FIG. 5.

FIG. 9 is a cross-sectional view for describing the method of forming the magnetic memory device illustrated in FIG. 5.

Referring to FIG. 9, a lower conductive layer 106, a high resistance layer 145', a variable pinning layer 140', a guide free layer 135', a free reversing layer 130', a storage free layer 125', a tunnel barrier layer 120', a pinned layer 115', an invariable pinning layer 110', and an upper conductive layer 152 are formed sequentially on a substrate 100 having a lower contact plug 104.

The high resistance layer 145' may be formed by oxidizing a surface of the lower conductive layer 106. Alternatively, the high resistance layer 145' may be formed by forming on the lower conductive layer 106, a material layer formed of the same material as the variable pinning layer 140' at a thickness of a few to tens of angstroms, and oxidizing the material layer. Alternatively, the high resistance layer 145' may be formed of a different material layer having high resistance by a chemical vapor deposition technology.

The pinned layer 115' may include a first magnetic layer 111' contacting with the invariable pinning layer 110', the second magnetic layer 113' contacting with the tunnel barrier layer 120', and a pinned reversing layer 112' interposed between the first and second magnetic layers 111' and 113'.

The layers 145', 140', 135', 130', 125', 120', 115' and 110' between the lower conductive layer 106 and the upper conductive layer 152 form a magnetic tunnel junction multilayer 150'.

The upper conductive layer 152, the magnetic tunnel junction multilayer 150', and the lower conductive layer 106 are successively patterned, thereby forming a lower electrode 106, a magnetic tunnel junction pattern 150a', and an upper electrode 152a that are stacked in the sequential order illustrated in FIG. 5.

Subsequent processes may be performed in the same manner as described with reference to FIG. 8. Thus, the magnetic memory device of FIG. 5 may be implemented.

According to the present invention, a magnetic direction of a storage free pattern is arranged in the same direction as a magnetization direction of a pinned pattern by electrons within a program current flowing through the pinned pattern, and is arranged in the opposite direction to the magnetization direction of the pinned pattern by electrons within a program current flowing through a guide free pattern. That is, the magnetic memory device according to the present invention does not require the conventional digit line. As a result, an increase in a cell area due to the conventional digit line can be prevented, and peripheral circuits for driving the digit line can be removed, thereby making it possible to implement a highly integrated magnetic memory device. Also, fine alignment processes used to form the digit line can be omitted, thereby very much simplifying the method of forming the magnetic memory device and thus improving the productivity. Furthermore, power consumption required to drive the related digit line can be removed, so that a magnetic memory device with low power consumption may be implemented.

Also, a magnetization direction of a guide free pattern is not pinned by the variable pinning pattern at the time of a program operation, and is pinned by the variable pinning pattern at the time of a read operation. Accordingly, a magnetization direction of a storage free pattern storing data is pinned in every state (e.g., a reading operation, a wait state, etc.) excluding the program operation by the variable pinning pattern, the guide free pattern, and a free reversing pattern. As a result, a super-paramagnetic limit is overcome, and thus the planar area of a magnetic tunnel junction pattern can be reduced, so that a more highly integrated magnetic memory device can be implemented.

Having described the principles of the invention in different embodiments, it will be apparent to those skilled in the art that various modifications and variations can be made in the present invention without departing from such principles. Thus, it is intended that the present invention covers the modifications and variations of this invention provided they come within the scope of the appended claims and their equivalents.

What is claimed is:

1. A method of forming nonvolatile magnetic memory-cells in a semiconductor magnetic memory device, the method comprising:

forming an invariable pinning pattern and a variable pinning pattern on a substrate, the variable pinning pattern including a first surface and a second surface opposite to the first surface;

forming a tunnel barrier pattern between the invariable pinning pattern and the variable pinning pattern;

forming a pinned pattern between the invariable pinning pattern and the tunnel barrier pattern, the pinned pattern having a magnetization direction pinned by the invariable pinning pattern;

forming a storage free pattern between the tunnel barrier pattern and the variable pinning pattern;

forming a guide free pattern between the storage free pattern and the variable pinning pattern, the guide free pattern directly contacting the first surface of the variable pinning pattern;

forming a free reversing pattern between the storage and guide free patterns, the free reversing pattern reversing a magnetization direction of the storage free pattern and a magnetization direction of the guide free pattern in the opposite directions;

forming a resistance pattern contacting with the second surface of the variable pinning pattern, the resistance pattern for generating Joule's heat, wherein data is stored and retrieved to and from the memory cells via current through the memory cells, and the semiconductor magnetic memory device including a switching device, wherein the invariable pinning pattern and the variable pinning pattern are each formed of an antiferromagnetic substance, the invariable pinning pattern being thicker than the variable pinning pattern.

2. The method of claim 1, wherein the invariable pinning pattern pins a magnetization direction of the pinned pattern during a read operation and a program operation, and the variable pinning pattern pins a magnetization direction of the guide free pattern during the read operation, the variable pinning pattern not pinning the magnetization direction of the guide free pattern during the program operation.

3. The method of claim 1, wherein the storage free pattern is formed thicker than the guide free pattern.

4. The method of claim 1, wherein the forming of the pinned pattern comprises:

forming a first magnetic pattern;

forming a second magnetic pattern; and forming a pinned reversing pattern interposed between the first and second magnetic patterns, the pinned reversing pattern reversing magnetization directions of the first and second magnetic patterns in the opposite directions, wherein the first magnetic pattern contacts with the invariable pinning pattern so that the magnetization direction thereof is pinned by the invariable pinning pattern, and the magnetization direction of the second magnetic patterns is pinned in the opposite direction to the pinned magnetization direction of the first magnetic pattern by the pinned reversing pattern, the second magnetic pattern contacting with the tunnel barrier pattern.

5. The method of claim 1, wherein the invariable pinning pattern, the pinned pattern, the tunnel barrier pattern, the storage free pattern, the free reversing pattern, the guide free pattern, and the variable pinning pattern are sequentially stacked on the substrate.

6. The method of claim 1, wherein the variable pinning pattern, the guide free pattern, the free reversing pattern, the storage free pattern, the tunnel barrier pattern, the pinned pattern, and the invariable pinning pattern are sequentially stacked on the substrate.

7. The method of claim 1, further comprising:

forming a lower insulating layer on a semiconductor substrate having a switching device formed therein;

forming a lower contact plug extending through the lower insulating layer and connecting to the switching device;

forming a lower electrode in contact with the lower contact plug, the lower electrode disposed between the lower contact plug and the invariable pinning pattern;

forming an upper electrode on the variable pinning pattern; and forming a conductive line electrically connected to the upper electrode.

8. The method of claim 2, wherein a maximum temperature at which a magnetization pinning force of the invariable pinning pattern is maintained is higher than a maximum temperature at which a magnetization pinning force of the variable pinning pattern is maintained.

9. The method of claim 8, wherein the invariable pinning pattern is formed of a first antiferromagnetic substance, and the variable pinning pattern is formed of a second antiferromagnetic substance having a blocking temperature lower than that of the first antiferromagnetic substance, wherein the blocking temperature is a maximum temperature at which an exchange coupling force of an antiferromagnetic substrate is maintained, and the exchange coupling force is the magnetization pinning force.

10. The method of claim 1, wherein the resistance pattern is formed by oxidizing the second surface of the variable pinning pattern to contain oxygen and material elements contained in the variable pinning pattern.

11. A method of forming a nonvolatile magnetic memory cell including a magnetic tunnel junction pattern for storage and retrieval of data to and from the nonvolatile magnetic memory cell in a semiconductor magnetic memory device, the method comprising:

forming an invariable pinning pattern on a substrate;

forming a pinned pattern on the invariable pinning pattern, the pinned pattern having a magnetization direction pinned by the invariable pinning pattern;

forming a tunnel barrier pattern on the pinned pattern;

forming a storage free pattern on the tunnel barrier pattern, the storage free pattern having a magnetization direction parallel or anti-parallel to the magnetization direction of the pinned pattern by electrons flowing through the memory cell;

forming a free reversing pattern on the storage free pattern;

forming a guide free pattern on the free reversing pattern, wherein the free reversing pattern reverses a magnetization direction of the guide free pattern in an opposite direction to the magnetization direction of the storage free pattern;

forming a variable pinning pattern on the guide free pattern, the variable pinning pattern directly contacting the guide free pattern; and forming a resistance pattern on the variable pinning pattern, the resistance pattern for generating Joule's heat, wherein the invariable pinning pattern and the variable pinning pattern are each formed of an antiferromagnetic substance, the invariable pinning pattern being thicker than the variable pinning pattern.

12. The method of claim 11, wherein the variable pinning pattern lose a magnetization pinning force by heat from the tunnel barrier pattern.

13. The method of claim 12, wherein the guide free pattern has a not pinned magnetization by the heat from the tunnel barrier pattern, and a pinned magnetization by the magnetization pinning force of the variable pinning pattern.

14. The method of claim 12, further comprising:

forming a switching device on the substrate;

forming a lower electrode on the substrate, electrically connected to the switching device;

forming an upper electrode on the variable pinning pattern; and forming a conductive line connected to the upper electrode.

15. The method of claim 14, further comprising:

forming a contact electrically connecting the switching device and the lower electrode, wherein the switching device is a MOS transistor.

16. The method of claim 14, wherein forming the invariable pinning pattern, the pinned pattern, the tunnel barrier pattern, the storage free pattern, the free reversing pattern, the guide free pattern and the variable pinning pattern, forming the lower electrode and forming the upper electrode comprising:

forming a lower conductive layer on the substrate;

forming a invariable pinning layer, a pinned layer, a tunnel barrier layer, a storage free layer, a free reversing layer, a guide free layer and a variable pinning layer on the lower conductive layer sequentially;

forming an upper conductive layer on the variable pinning layer; and patterning the upper conductive layer, the variable pinning layer, the guide free layer, the free reversing layer, the storage free layer, the tunnel barrier layer, the pinned layer, the invariable pinning layer and the lower conductive.

* * * * *